United States Patent
Aminpur et al.

(10) Patent No.: US 7,151,055 B2
(45) Date of Patent: Dec. 19, 2006

(54) TECHNIQUE FOR FORMING A GATE ELECTRODE BY USING A HARD MASK

(75) Inventors: Massud Aminpur, Dresden (DE); Kay Hellig, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 41 days.

(21) Appl. No.: 10/974,119

(22) Filed: Oct. 27, 2004

(65) Prior Publication Data

US 2005/0118801 A1 Jun. 2, 2005

(30) Foreign Application Priority Data

Nov. 28, 2003 (DE) ................ 103 55 581

(51) Int. Cl.
*H01L 21/4763* (2006.01)

(52) U.S. Cl. ............. 438/637; 438/299; 438/301; 257/E21.635

(58) Field of Classification Search ........... 438/637; 437/638, 635
See application file for complete search history.

(56) References Cited

U.S. PATENT DOCUMENTS

| 5,946,579 A | * | 8/1999 | Fulford et al. ........... 438/303 |
| 6,156,632 A | | 12/2000 | Schuegraf ................ 438/592 |
| 2002/0177280 A1 | | 11/2002 | Schoenborn ............. 438/299 |

* cited by examiner

*Primary Examiner*—Andy Huynh
*Assistant Examiner*—Thinh T Nguyen
(74) *Attorney, Agent, or Firm*—Williams, Morgan & Amerson, P.C.

(57) ABSTRACT

The anisotropic etch process for forming circuit elements such as a gate electrode is accomplished by using a hard mask instead of a resist feature, thereby avoiding a complex resist trim process when critical dimensions are required, which are well below the resolution of the involved photolithography. Moreover, the critical dimension may be adjusted by means of a deposition process rather than by a resist trim process.

17 Claims, 4 Drawing Sheets

TECHNIQUE FOR FORMING A GATE ELECTRODE BY USING A HARD MASK

BACKGROUND OF THE INVENTION

1. Field of the Invention

The present invention generally relates to the fabrication integrated circuits, and, more particularly, to the formation of small circuit elements, such as a gate electrode of a field effect transistor, on a substrate, wherein the dimensions of the circuit elements are significantly less than the resolution of the involved lithographic technique.

2. Description of the Related Art

The trend in recent years to steadily decrease the feature sizes of elements in micro-structures, such as circuit elements in integrated circuits, will continue in the near future, wherein reproducible and robust processes have to be established that allow the formation of a huge number of integrated circuits in a cost-efficient manner. Presently, sophisticated integrated circuits that are available as mass-produced products include elements having dimensions which are well below the optical resolution of the lithography apparatus used for transferring a pattern from a mask into a material layer formed on a substrate. Minimum dimensions of circuit elements are presently 100 nm and less, wherein the wavelength of radiation used for optically transferring patterns from the mask to the substrate surface are in the deep ultraviolet range at a wavelength of, e.g., 248 nm and, according to recent developments, at approximately 193 nm. In this wavelength range, the absorption of optical transmissive elements, such as lenses, is considerable and will drastically increase with a further reduction of the wavelength. Thus, merely reducing the wavelength of light sources for lithography apparatus is not a straightforward development and may not easily be implemented in mass production of circuit elements having feature sizes of 50 nm and less.

The total resolution of reliably transferring circuit patterns from a mask to a substrate is determined, on the one hand, by the intrinsic optical resolution of the photolithography apparatus, the characteristics of materials involved in the photolithography patterning process, such as the photoresist and any anti-reflective coatings (ARC) that are provided to minimize deleterious scattering and standing wave effects in the photoresist, and by deposition and etch procedures involved in forming the resist and ARC layers, and etching these layers after exposure. In particular, the highly non-linear behavior of the photoresist, in combination with sophisticated ARC layers and lithography mask techniques, allows the formation of resist patterns having dimensions considerably below the intrinsic optical resolution of the photolithography apparatus. Additionally, a further post-lithography trim etch process is applied to further reduce the feature sizes of the resist pattern that will serve as an etch mask in subsequent anisotropic steps for transferring the resist pattern into the underlying material layer. Thus, this resist trim process enables the reduction of the critical dimension of the gate electrode to a size that is well beyond the wavelength of the photolithography.

It is, however, of great importance to accurately control the resist trim process so as to form a precisely defined mask for the subsequent anisotropic etch process for patterning the gate layer stack, since any variation of the gate length directly translates into a corresponding variation of operating speed of the final device.

Figure 1A:
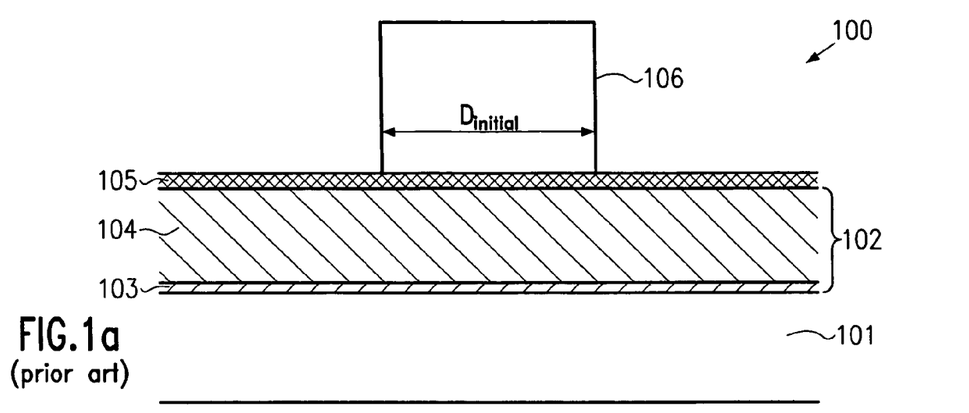
FIGS. 1a–1c schematically show cross-sectional views of a semiconductor device during various manufacturing stages in forming a circuit element with a lateral size that is substantially controlled by a resist trim process in accordance with a conventional process technique.
Figure 1B:
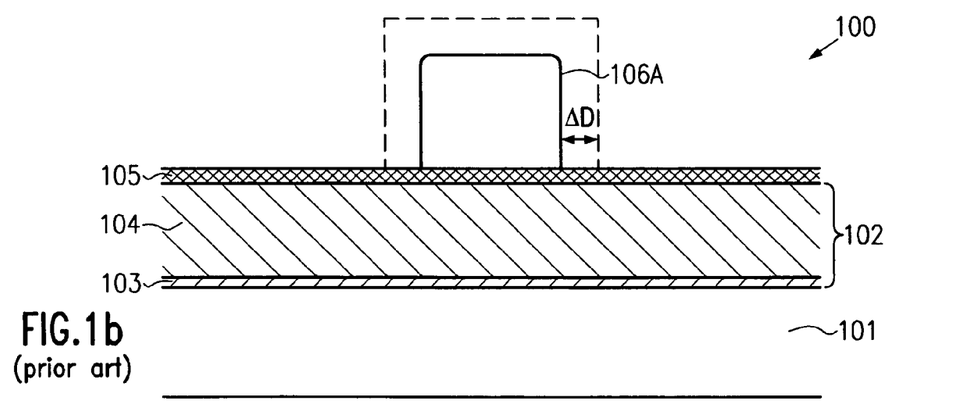
Figure 1C:
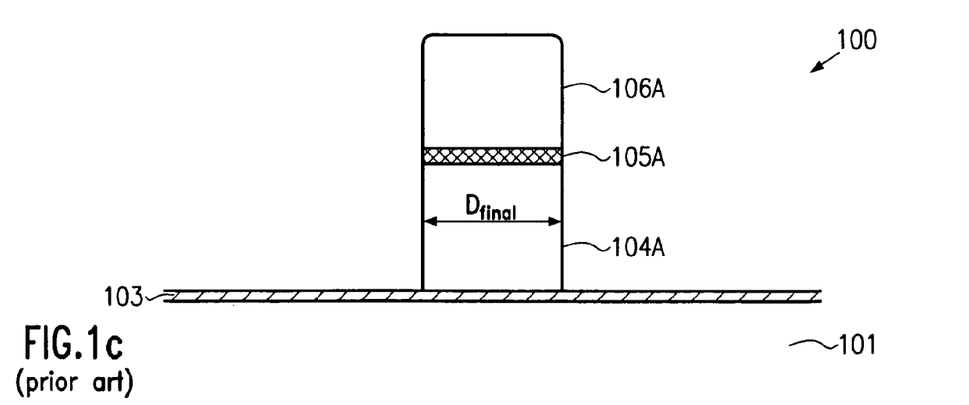

With reference to FIGS. 1a–1c, a typical conventional process flow for forming a gate electrode of a field effect transistor including a control regime for the resist etch trim will now be described in more detail. FIG. 1a schematically shows a cross-sectional view of a semiconductor device 100 during an early stage of the fabrication of a line-like circuit element, such as the gate electrode of a field effect transistor. The semiconductor device 100 comprises a substrate 101, for instance a silicon substrate, or any other appropriate substrate with a suitable semiconductive layer formed thereon. A layer stack 102, for instance appropriately configured so as to enable the formation of a gate electrode, is formed on the substrate 101 and may include a gate insulation layer 103 and a gate material layer 104, such as a polysilicon layer. An anti-reflective coating 105 of appropriate thickness and material composition, for instance comprised of silicon-enriched silicon nitride, silicon oxynitride, and the like, is formed on the layer stack 102, followed by a resist mask feature 106 having an initial lateral size, which is referred to as $D_{initial}$, wherein the lateral size $D_{initial}$ is oriented along a length direction, i.e., the horizontal direction in the plane of FIG. 1a, of a gate electrode to be formed from the layer stack 102.

A typical process flow for forming the semiconductor device 100 as shown in FIG. 1a may comprise the following processes. First, the layer stack 102 is formed, for instance by forming the gate insulation layer 103 using advanced oxidation and/or deposition methods as are well known in the art. Subsequently, the polysilicon layer 104 may be deposited by chemical vapor deposition (CVD), followed by the deposition of the anti-reflective layer 105, the thickness and a material composition of which are selected so as to significantly reduce a back reflection of radiation during a subsequent lithography process. The thickness may typically range from 30–150 nm for a silicon-rich nitride layer that may be formed by thermal CVD, plasma enhanced CVD, and the like, while controlling the material composition during the deposition process. Next, a resist layer comprised of a deep UV-sensitive material is deposited, for instance by spin-on techniques, and is subsequently exposed to a deep UV radiation having a wavelength of, for example, 248 nm or 193 nm. After development of the resist layer, including any well known pre- and post-development procedures such as baking and the like, the resist mask feature 106 is formed having the lateral dimension $D_{initial}$, which may be significantly greater than a desired gate length $D_{target}$ of the gate electrode still to be formed. As previously explained, even for a highly non-linear behavior of the photoresist used, the lateral size $D_{initial}$ of the resist mask feature 106 still significantly exceeds the required target value by about 30 to 50%, especially as the critical feature size $D_{target}$ is on the order of 100 nm and significantly less. For this reason, the etch process for forming the gate electrode includes a first step for reducing the size of the resist mask feature 106 in a well-controlled manner, i.e., a so-called photoresist trim etch process. Thereafter, an etching process is performed to etch the anti-reflective coating 105 and the polysilicon layer 104 using the trimmed resist mask feature 106 having the reduced size as an etch mask. To this end, an appropriately selected etch chemistry on the basis of an oxygen-containing plasma is provided in a gate etch tool, wherein the material removal of the resist mask feature 106, i.e., the reduction of the lateral size $D_{initial}$ and of course of the height of the resist mask feature 106, may depend substantially linearly on the etch time for a plurality of available resists.

FIG. 1b schematically shows the semiconductor device 100 after completion of the resist trim process, wherein the lateral size $D_{initial}$ is reduced by amount of $2 \cdot \Delta D$, wherein $\Delta D$ may be controlled, in principle, by accordingly adjusting the etch time.

Thereafter, the reactive atmosphere in the gate etch chamber is correspondingly altered so as to provide a highly anisotropic etch ambient that enables the etching of the anti-reflective coating 105 and the polysilicon layer 104, wherein a high selectivity to the gate insulation layer 103 is required so as to not unduly damage the underlying substrate 101 when the etch front stops within the thin gate insulation layer 103.

FIG. 1c schematically shows the semiconductor device 100 after the completion of the anisotropic etch process, thereby forming a gate electrode 104A, while the residue 105A of the anti-reflective coating 105 and the residue of the resist mask feature 106A cover the top surface of the gate electrode 104A. The lateral dimension of the gate electrode 104A, i.e., the gate length, is denoted as $D_{final}$, which should substantially conform to the desired critical dimension $D_{target}$, as any significant deviation therefrom would lead to a significantly changed device performance. In highly sophisticated integrated circuits, the desired critical dimension of the gate length may be significantly less than 100 nm with a tolerance of ±1 nm.

In the conventional process flow as described above, however, the trimming of the resist mask feature 106 is limited by several factors. For instance, a significant deterioration of the profile of the resist mask feature 106 may occur when the required gate length is significantly less than about 50% of the initial length of the feature 106. Furthermore, using advanced photoresists sensitive to small wavelengths, such as 193 nm, typically requires a restricted thickness of the resist layer, thereby also limiting the masking effect of the feature 106A in the subsequent etch process. Even for a manufacturable thickness of the resist layer, upon further device scaling, the aspect ratio, i.e., resist thickness to critical dimension, increases, and may lead to a pattern collapse during the trim etch process for forming the feature 106A. For these reasons, the finally obtained gate electrode 104A may exhibit deviations from the desired design target value owing to imperfections of the resist feature 106A. More importantly, further scaling of critical dimensions seems extremely difficult to be achievable by the conventional technique for the reasons set forth above.

In view of this situation, there exists a need for an improved technique that enables the control of a critical dimension of a circuit element, such as a gate electrode, with an enhanced accuracy even if dimensions are further scaled. The present invention is directed to overcoming, or at least reducing the effects of, one or more of the problems set forth above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of a circuit element, such as a gate electrode of a field effect transistor, by using a hard mask instead of a resist mask. Additionally, the dimensions of the hard mask may be defined by a deposition process rather than by a resist trim etch process, as is the case in the conventional process flow. Since deposition techniques are well established in the art, any insufficiencies accompanying the resist trim process of the conventional art in forming an etch mask of dimensions that are well beyond the resolution of the corresponding photolithography may be eliminated or at least significantly reduced. In one illustrative embodiment, a mask layer is patterned by photolithography, wherein cutting edge lithography may be used or already well-approved lithography techniques may be employed, depending on the process requirements, to form an opening in which, in turn, an etch mask is formed for a subsequent anisotropic etch process. In a further variant, the actual size of the opening may be finally determined by sidewall spacers formed on sidewalls of the opening, wherein a width of the spacers is substantially defined by a thickness of a deposited material layer from which the spacer elements are formed by anisotropic etching.

In a further illustrative embodiment of the present invention, a method comprises forming a layer above a substrate and forming a mask layer above the layer. Furthermore, an opening is formed in the mask layer having dimensions that correspond to a circuit feature to be formed. An etch mask is then formed in the opening and the mask layer is removed. Finally, the layer is etched while using the etch mask, thereby forming the circuit feature. In particular embodiments, the layer may represent a gate electrode layer stack for a specified field effect transistor.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously noted, the present invention is based on the concept of avoiding a resist trim process having the above-specified disadvantages so as to reduce process variations and to also provide the potential for substantially scaling critical dimensions further down without being restricted to the resolution of the involved photolithography. Hence, the present invention is particularly advantageous when applied to semiconductor devices including circuit features, such as the gate electrode of a field effect transistor, with dimensions of 100 nm and significantly less. For instance, the present invention enables the formation of field effect transistors having a gate length of 50 nm or even less, while still using the well-established 248 nm photolithography, thereby keeping production costs moderately low. In other cases, it may be considered advantageous to relax the constraints on the photolithography. Therefore, a less critical and less expensive imaging process may be used in combination with the present invention so as to form circuit elements of feature sizes greater than 100 nm, thereby also improving production yield and lowering production costs.

Figure 2A:
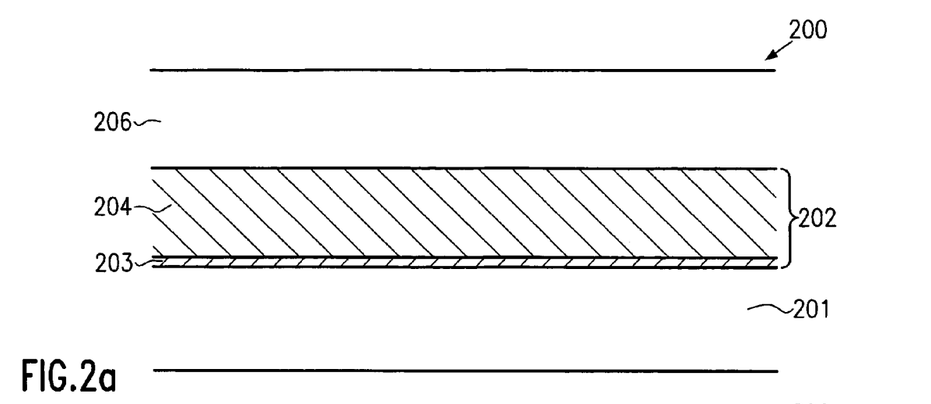
FIGS. 2a–2g schematically show cross-sectional views of a semiconductor device during various manufacturing stages in forming a circuit element, the dimensions of which are controlled during an anisotropic etch process by means of a hard mask in accordance with illustrative embodiments of the present invention.

With reference to FIGS. 2a–2g and 3a–3c, further illustrative embodiments of the present invention will be described in more detail. In FIG. 2a, a semiconductor device 200 comprises a substrate 201, which may be a silicon-on-insulator (SOI) substrate for sophisticated silicon-based semiconductor devices. In other embodiments, the substrate 201 may be any substrate, for instance a bulk semiconductor substrate, which is appropriate to form thereon integrated circuits. A layer stack 202 is formed above the substrate 201, wherein the layer stack 202 may comprise, in one particular embodiment, a gate insulation layer 203 and a layer 204 of a gate electrode material such as polysilicon. As previously explained with reference to FIG. 1a, the layer stack 202 is configured to enable the formation of a specified circuit element, wherein, in advanced silicon-based CMOS technologies, the gate insulation layer 203 may be comprised of nitrogen-enriched silicon dioxide, silicon nitride, or may include a high-k dielectric material with a thickness in accordance with device requirements. For instance, a silicon dioxide based gate insulation layer of highly advanced field effect transistors may have a thickness in the range of approximately 1.5–3 nm. Moreover, in the following, the gate electrode material layer 204 is referred to as a polycrystalline silicon layer since the majority of logic circuits of various architectures includes field effect transistors having a gate electrode formed on the basis of polysilicon. It should be appreciated, however, that any other appropriate gate electrode material or any other material considered appropriate for the formation of a specified circuit element may be used for the layer 204. The semiconductor device 200 further comprises a mask layer 206 comprised of, for instance, a dielectric material such as silicon dioxide, silicon nitride, and the like, if silicon-based semiconductor devices are considered.

A typical process flow for forming the semiconductor device 200 as shown in FIG. 2a may comprise substantially the same processes as are also described with reference to FIG. 1a, wherein, additionally, the mask layer 206 is formed by any appropriate deposition method, such as plasma enhanced chemical vapor deposition and the like. It should be noted that the thickness of the mask layer 206 is not critical for the further processing and may thus be selected in accordance with process requirements. For instance, the thickness of the mask layer 206 may range from approximately 50–200 nm in a process for patterning the layer stack 202 into a circuit feature having a lateral dimension of 100 nm and less.

Figure 2B:
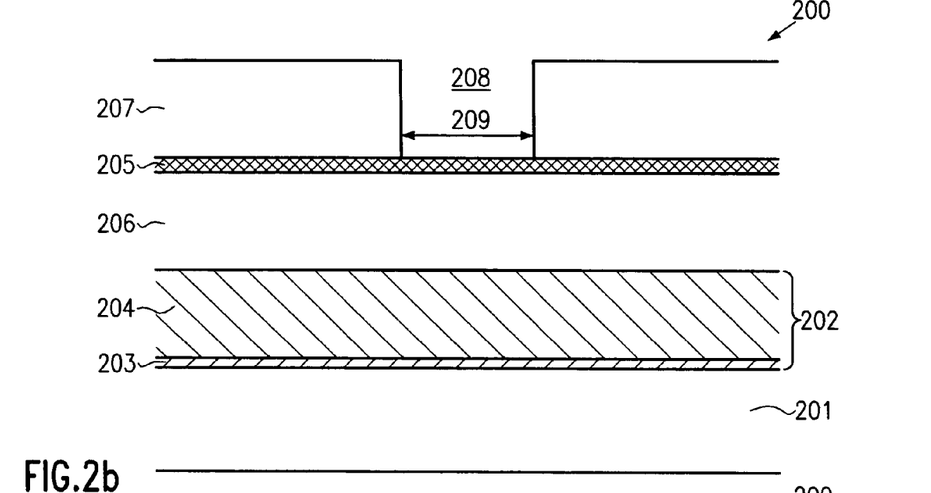

FIG. 2b schematically shows the semiconductor device 200 in a further advanced manufacturing stage. The device 200 comprises a resist layer 207 having formed therein an opening 208 having dimensions 209, which may be considerably greater than the dimensions of a circuit element to be formed in the layer stack 202. In other embodiments, however, the dimensions 209 may be formed so as to substantially correspond to the design target value of a circuit element under consideration when the desired critical dimension is well within the capability of the photolithography technique involved in forming the opening 208. Moreover, the device 200 may comprise a bottom anti-reflective coating 205 having substantially the same characteristics as is previously explained with reference to the layer 105 in FIG. 1a.

The device 200 as shown in FIG. 2b may be obtained by the following processes. After depositing the anti-reflective coating 205, the resist layer 207 may be deposited by any appropriate spin-on techniques. Thereafter, the resist layer 207 may be exposed with an appropriate exposure wavelength, wherein, contrary to the conventional approach, a substantially inversed photolithography mask is used so as to obtain the opening 208 rather than a resist feature after development of the exposed resist layer 207. Except for the inverse lithography mask, substantially the same criteria apply for the formation of the opening 208, as has been previously explained with reference to the resist feature 106. However, as will be seen in the following, the further reduction of the dimension 209, if required, is achieved by deposition and anisotropic etch techniques rather than by trimming a resist feature, as in the conventional approach.

Figure 2C:
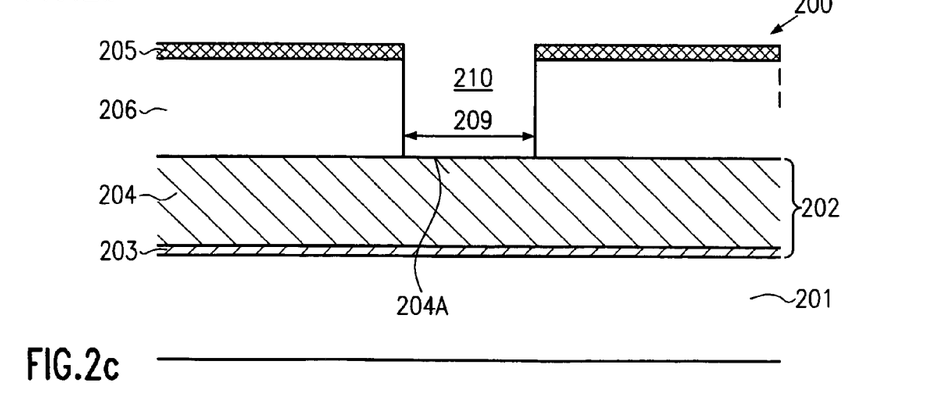

FIG. 2c schematically shows the semiconductor device 200 after forming an opening 210 in the mask layer 206, which has substantially the same dimensions 209 compared to the opening 208 formed in the resist layer 207. The opening 210 may be formed by well-established anisotropic etch techniques, for instance on the basis of a fluorinecontaining plasma etch recipe, when the mask layer 206 is comprised of silicon dioxide. During the anisotropic etch process, the anti-reflective coating 205 may also be opened, wherein, depending on process requirements, the same etch tool with a different or the same etch recipe may be used. The anisotropic etch process may be stopped upon clearing a surface portion 204a of the layer stack 202, i.e., of the layer 204. For example, if the layer 204 is comprised of polysilicon and the mask layer 206 is substantially comprised of silicon dioxide, the above-identified etch recipe exhibits a sufficient etch selectivity so as to keep a material removal of the layer 204 low, when the etch front reaches the surface 204a. In other embodiments, an etch stop layer (not shown) may be formed between the layer stack 202 and the mask layer 206, for instance comprised of silicon nitride, thereby assuring that the etch process reliably stops on or in the optional etch stop layer. The optional exposed etch stop layer in the opening 210 may then be removed by a selective wet chemical etch process, for instance based on hot phosphoric acid when silicon nitride is used as the etch stop material, thereby exposing the surface 204a.

In a further alternative, the mask layer 206 may be comprised of silicon nitride and a silicon dioxide containing an etch stop layer may be provided so as to stop a corresponding nitride etch process to form the opening 210 on or in the corresponding silicon dioxide layer. However, any other appropriate materials and etch schemes may be used, as long as these alternatives allow the reliable transfer of the opening 208 of the resist layer 207 into the underlying mask layer 206 so as to substantially preserve the dimension 209.

Figure 2D:
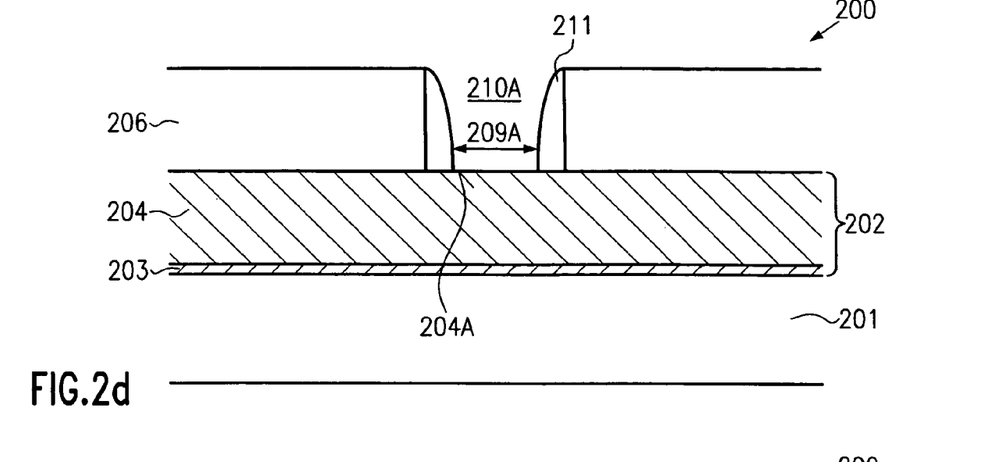

FIG. 2d schematically shows the device 200 with spacer elements 211 formed on the sidewalls of the opening 210 so as to form a reduced opening 210a having a reduced dimension 209a. The reduced dimension 209a may represent the design target value of a critical dimension, such as the gate length of a field effect transistor, wherein the dimension 209a is, as indicated by FIGS. 2c and 2d, determined by the dimension 209, that is, by the capability of the involved photolithography and by the width of the spacer elements 211. The formation of the spacer elements 211 may comprise a deposition of a spacer layer with a predefined thickness in a highly conformal manner, wherein then an anisotropic etch process is performed so as to remove the material of the spacer layer from horizontal portions of the device 200, such as the bottom of the opening 210a, thereby forming the spacer elements 211 having a width defined by the initially deposited layer thickness. For instance, the spacer elements 211 may be comprised of essentially the same material as the mask layer 206 and may be deposited by corresponding well-established and well-controllable deposition methods so as to obtain a thickness of the deposited layer that varies across the substrate surface of the substrate 201 with less than approximately 2–3 percent. The layer deposited may then be anisotropically etched, for instance, until the end of the etch process is indicated by the clearance of the bottom of the layer 210a. In other embodiments, the spacer elements 211 may be formed of a material other than the material of the mask layer 206. For example, if the mask layer 206 is comprised of silicon dioxide, silicon nitride may be deposited, possibly preceded by the deposition of a thin silicon dioxide layer, and an appropriate anisotropic etch process may be performed. When the thin silicon dioxide layer is provided as an etch stop layer, the anisotropic etch process may reliably be stopped prior to removing material from the underlying surface portion 204a. When the optional etch stop layer is not provided, the minor material removal at the surface 204a during the final phase of the etch process may be tolerable or may be taken into consideration when selecting an initial thickness of the layer 204.

Thereafter, the optional etch stop layer, if provided, may be removed by any appropriate selective etch process, such as a wet chemical process on the basis of hydrogen fluoride (HF) when silicon dioxide is used as the etch stop layer.

It should be appreciated that even for very sophisticated applications, highly conformal deposition techniques are available, which enable the formation of a layer of substantially uniform thickness over a patterned substrate. Thus, although typically the deposition rate is reduced, compared to, for instance, plasma enhanced CVD techniques, atomic layer deposition (ALD) may be used if a superior thickness uniformity and enhanced controllability is required. Consequently, even if cutting edge photolithography is employed in forming the opening 210, the spacer elements 211 may still be formed at precise control of the width thereof.

After exposing the surface portion 204a, according to one particular embodiment, a layer of refractory metal, such as cobalt, titanium, nickel, platinum, or any combination thereof, or any alloys thereof, is deposited over the device 200 and within the opening 210a, wherein any cleaning processes as required for removing material residues from the surface portion 204a may have been performed prior to the deposition of the refractory metal. Corresponding cleaning processes and deposition processes for refractory metals are well established in the art, since these process sequences are also used during the formation of metal silicide regions on gate electrodes and source and drain regions of sophisticated field effect transistors. After the deposition, a heat treatment is performed so as to initiate a selective modification of the surface portion 204a in the form of a metal silicide formation 212 at the bottom of the opening 210a and within the layer 204. Since the remaining areas of the device 200 are covered by the mask layer 206 and the spacer elements 211, a chemical reaction, initiated by the heat treatment, between the refractory metal deposited and any underlying material is substantially restricted to the surface portion 204a. In one embodiment, cobalt may be deposited as the refractory metal and may be heat treated by a rapid thermal annealing at a temperature in the range of approximately 600–700° C., thereby forming cobalt monosilicide and cobalt disilicide at and in the vicinity of the surface portion 204a. Depending on process specifics, the heat treatment may be carried out so as to substantially convert all of the refractory metal deposited within the opening 210a into cobalt disilicide, wherein the process is completed once all of the cobalt in the opening 210a is consumed. Hence, the amount of silicon consumed may be determined by the initially deposited layer thickness and the anneal parameters by which the ratio of cobalt disilicide to cobalt monosilicide may be adjusted. The refractory metal, such as cobalt and the like, may be deposited by well approved physical or chemical vapor deposition techniques providing a high degree of uniformity of the layer thickness. Consequently, the chemical reaction initiated by the heat treatment is fed by a substantially uniform metal layer, resulting in a substantially uniform metal silicide portion in the vicinity of the surface portion 204a.

In other embodiments, the amount of metal silicide created by the chemical reaction may be controlled by the anneal parameters only in that the refractory metal is deposited in excess and the silicidation process is controlled by the anneal temperature and the duration of the process. In this way, any non-uniformities of the layer thickness of the refractory metal may be rendered negligible as long as the minimal thickness of the refractory metal is sufficient to feed the chemical reaction in accordance with the desired duration of the anneal process. Subsequently, non-reacted refractory metal, i.e., metal deposited on the mask layer 206 and the spacer elements 211 and possibly refractory metal deposited on the surface portion 204*a* and not consumed by chemical reaction, may be removed by well-established wet chemical etch processes. In other embodiments, it may be advantageous to perform a first heat treatment at a moderately high temperature to still initiate a chemical reaction between the refractory metal and the material of the layer 204 while still avoiding substantially any chemical reaction between the mask layer 206 and the refractory metal, which may occur, even though in a very reduced degree compared to the reaction of silicon and the refractory metal in the layer 204, at elevated temperatures. After the first heat treatment, the non-reacted refractory metal may be removed and a second heat treatment may be carried out so as to stabilize a metal silicide formed in the vicinity of the surface portion 204*a*. For example, if cobalt is used, in a first step, substantially cobalt monosilicide is created at temperatures in the range of 500–600° C., thereby minimizing a reaction of the cobalt with non-silicon areas, whereas the cobalt monosilicide is substantially completely converted into the more stable cobalt disilicide at elevated temperatures of 600–700° C. in the second heat treatment. It should be appreciated, however, that the specifics of the heat treatment have to be determined on the basis of the characteristics of the refractory metal and the silicide formed thereon. Corresponding measurements may readily be performed or experimental and theoretical data of a variety of refractory metal silicides are known in the art and may be used so as to establish appropriate process recipes for the formation of a metal silicide at the surface portion 204*a*.

Figure 2E:
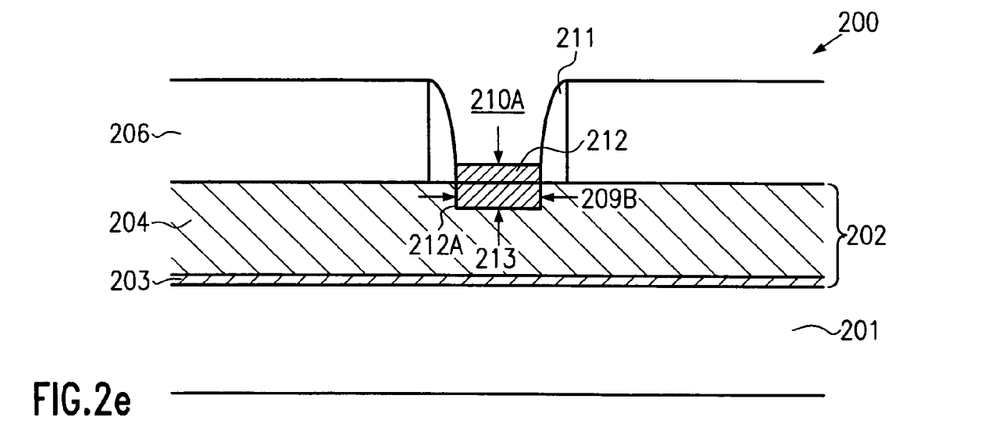

FIG. 2*e* schematically shows the device 200 after completion of the above-described process for modifying the surface portion 204*a* by forming a metal silicide portion 212 as an etch mask having a thickness 213. As previously explained, the thickness 213 may be determined by the layer thickness of the refractory metal and/or by the parameters of the heat treatment in initiating the silicidation process. In some embodiments, one or more appropriate sets of parameters in forming the metal silicide etch mask 212 may be determined by using one or more test substrates or product substrates that may be subjected to a measurement procedure so as to precisely obtain the thickness 213 and possibly the lateral profile of the etch mask 212. That is, the modification of the surface portion 204*a* (FIG. 2*d*) may result in a lateral expansion at side portions 212*a* caused by the diffusion of the atoms during the chemical reaction in forming the metal silicide etch mask 212. Since the lateral dimension 209*b* of the metal silicide etch mask 212 substantially determines the lateral dimension of the circuit element to be formed from the layer stack 202, it may be advantageous to measure the cross-sectional profile of the metal silicide etch mask 212 by appropriate measurement methods, such as scanning electron microscopy. From corresponding measurement results, a relation may be established between at least one process parameter in forming the metal silicide etch mask 212 and the finally obtained thickness 213 and the lateral extension 209*b*. Based on this relation, a corresponding value or values for the at least one process parameter may be selected so as to form the metal silicide etch mask 212 having the required dimensions. It should be appreciated that in some embodiments the thickness 213 of the metal silicide etch mask 212 may be selected so as to provide the required masking effect during a subsequent anisotropic etch process in patterning the layer stack 202. Hence, the thickness 213 may significantly depend on the etch selectivity provided by the metal silicide etch mask 212 compared to the material of the layer stack 202. Thus, in some cases, a relatively moderate thickness 213 in the range of approximately 10–30 nm may be sufficient for the patterning process. Hence, the modification of the lateral dimension 209*b* compared to the dimension 209*a* may be considered negligible.

In a further embodiment, however, any difference between the dimensions 209*a* and 209*b* may be taken into consideration by correspondingly adapting the width of the spacer elements 211 in the preceding formation process. That is, the spacer elements 211 may be formed so as to create the dimension 209*a* that is less than the desired dimension of the circuit element to be formed, while the lateral expansion of the metal silicide etch mask 212 during the modification process in forming the metal silicide etch mask 212 then results in the desired critical dimension 209*b*. In other embodiments, the stability and electrical characteristics of the metal silicide etch mask 212 may be considered appropriate for the further processing of the device without removing the metal silicide etch mask 212. In this case, the thickness 213 may be selected in conformity with the requirements demanded by the completed circuit elements, such as a completed gate electrode having formed thereon a metal silicide portion. Hence, the spacer elements 211 and the metal silicide etch mask 212 may then be formed in accordance with process parameters so as to conform with these requirements and also to provide the desired lateral extension 209*b*. The corresponding relations for determining these process parameters may also be established on the basis of measurements as described above.

Figure 2F:
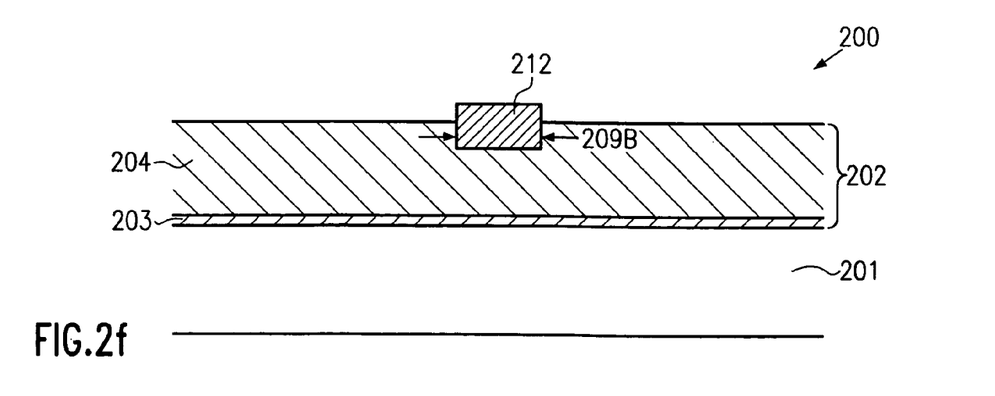

FIG. 2*f* schematically shows the device 200 after the removal of the mask layer 206 and the spacer elements 211. In one embodiment, the mask layer 206, when comprised of silicon dioxide, may be removed by a selective wet chemical etch process on the basis of HF. The mask layer 206 comprised of silicon nitride may be removed by hot phosphoric acid. The same applies to the spacer elements 211. Typically, the spacer elements 211 and the mask layer 206 are comprised of different materials, requiring the application of different etch procedures. Due to the high selectivity of the wet chemical etch process, a material removal of the metal silicide etch mask 212 is substantially negligible. If an etch chemistry is used that does not exhibit a high selectivity to the metal silicide etch mask 212, a corresponding removal of material may be compensated for in advance by correspondingly selecting the dimensions 213 and 209*b* during the formation of the metal silicide etch mask 212. In sophisticated applications, it is, however, preferable to use a highly selective etch chemistry so as to substantially maintain the lateral extension 209*b*, since then this dimension is substantially defined by a highly precise deposition process rather than by an etch process. Thereafter, the substrate 201 is subjected to an anisotropic etch process, on the basis of a chlorine/bromine-containing plasma etch atmosphere so as to pattern the layer stack 202.

Figure 2G:
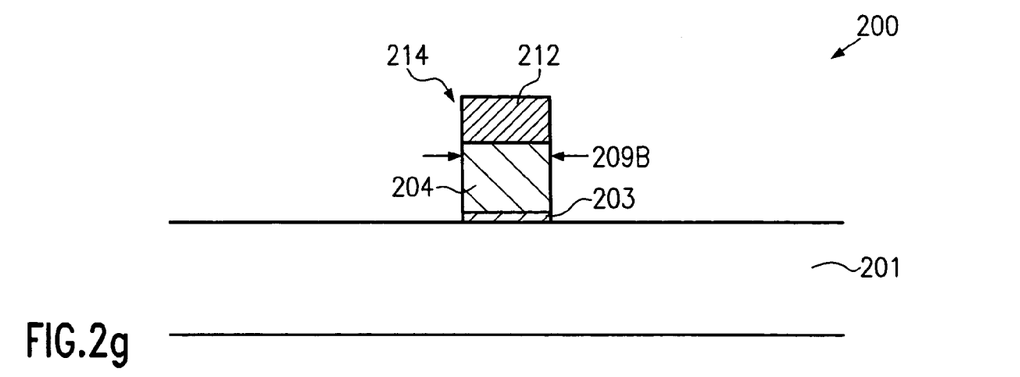

FIG. 2*g* schematically shows the device 200 after completion of the anisotropic etch process, thereby forming a circuit feature 214 including the metal silicide etch mask 212 and the residuals of the layer 204 and 203. In particular, the circuit feature 214 may represent a gate electrode structure for a field effect transistor to be formed. Due to the metal silicide etch mask 212, the circuit feature 214 has a lateral dimension substantially corresponding to the dimension 209*b*. Consequently, the lateral dimension 209*b* of the circuit feature 214 may be controlled by a deposition process, wherein available and well-approved photolithography techniques may be used while nevertheless providing the potential for achieving critical dimensions well beyond the capability of the conventional process flow.

The semiconductor device 200 may then be further processed, for instance by forming drain and source regions adjacent to the circuit feature 214, wherein, depending on process requirements, the etch mask 212 may be maintained so as to also act as an implantation mask. In some embodiments, the metal silicide etch mask 212 may be maintained as metal silicide for the completed gate electrode to increase the conductivity thereof. This enables the formation of metal silicide portions in drain and source regions independently from the metal silicide in the gate electrode structure, i.e., the metal silicide etch mask 212. Hence, a thickness, as well as the type of material used for the metal silicides formed in the drain and source regions, on the one side, and the gate electrode structure in the form of the metal silicide etch mask 212, on the other side, may independently be selected. In other embodiments, the metal silicide etch mask 212 may be removed so as to resume further manufacturing in accordance with conventional CMOS process technologies.

Figure 3A:
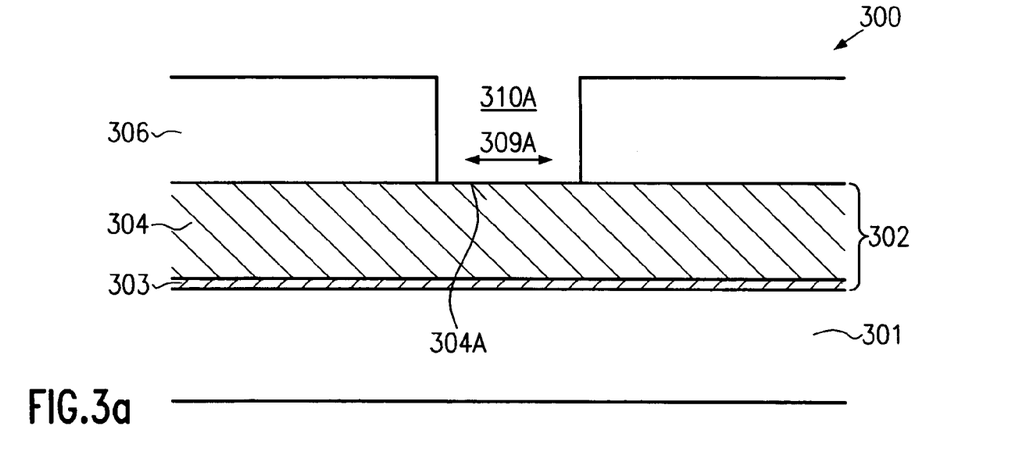
FIGS. 3a–3b schematically show cross-sectional views of a semiconductor device, wherein the dimensions of a circuit element are defined by an etch mask obtained by oxidizing a surface portion of the underlying material layer to be etched.

With reference to FIGS. 3a and 3b, further illustrative embodiments of the present invention will now be described. In FIG. 3a, a semiconductor device 300 comprises a substrate 301, a layer stack 302, for instance a gate electrode layer stack, and a mask layer 306 formed on the layer stack 302 and including an opening 310. The mask layer 306 may be comprised of, for instance, silicon nitride or any other non-oxidizable dielectric material. An optional etch stop layer (not shown) may be provided between the layer stack 302 and the mask layer 306, which may be comprised of, for instance, silicon dioxide.

A process for forming the semiconductor device 300 may substantially include the same steps as are already described with reference to FIG. 2a.

Figure 3B:
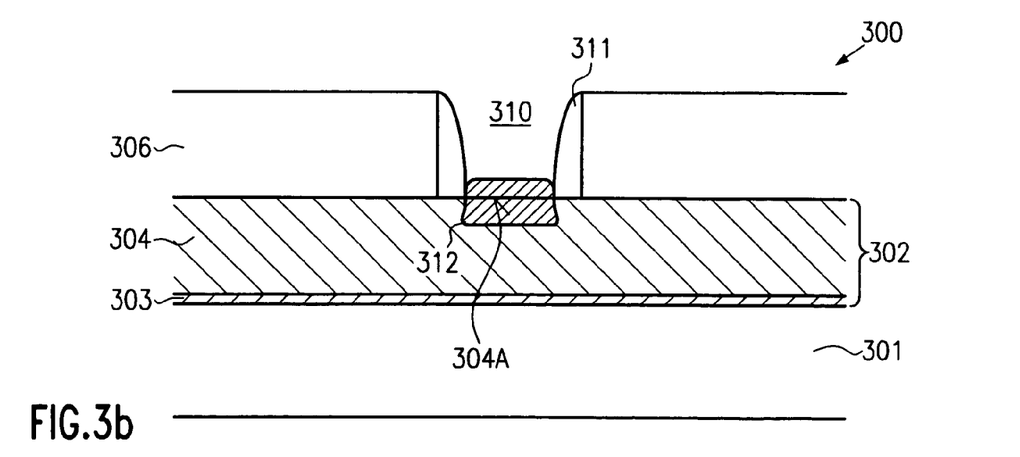

FIG. 3b schematically shows the semiconductor device 300 with spacer elements 311 formed on the sidewalls of the opening 310. Moreover, an etch mask 312 is formed in the vicinity of a surface portion 304a of the layer stack 302. The etch mask 312 may comprise modified material, for instance an oxide of the material forming the layer 304, such as silicon dioxide, when the layer 304 is provided in the form of a polysilicon layer.

Regarding the formation of the spacer elements 311, in principle, the same criteria apply as previously explained with reference to the spacer elements 211. However, in these embodiments, it may be advantageous to form the spacer elements 311 from a substantially non-oxidizable material, such as silicon nitride, so as to avoid any undesired reaction during the modification of the surface portion 304a by oxidation. Thereafter, the etch mask 312 may be formed by selectively oxidizing the surface portion 304a, wherein, when an optional etch stop layer has been provided during the formation of the sidewalls spacers 311, this etch stop layer may be removed prior to the oxidation, or, when comprised of silicon dioxide, the etch stop layer may be maintained during the further oxidation of the surface portion 304a. In particular, the oxidation mechanism of silicon is a well-known process and, hence, the dimensions of the etch mask 312 are well controllable by the corresponding oxidation parameters. Moreover, with respect to the finally obtained dimensions of the etch mask 312, that is, the formation of the spacer elements 311 in combination with the process of oxidizing the surface portion 304a, the same criteria as given above also apply in this case. For instance, the lateral oxidation for a desired thickness of the etch mask 312 may be taken into consideration by appropriately selecting the width of the spacer elements 311.

The further processing may be continued as is described with reference to FIG. 2e. That is, the mask layer 306 and the spacer elements 311 may be removed by a selective etch process, for instance using hot phosphoric acid, when the mask layer 306 and the spacer elements 311 are comprised of silicon nitride. Thereafter, the layer stack 302 is patterned by an anisotropic etch process using the etch mask 312, thereby forming a circuit feature having the desired lateral dimension. Thereafter, the etch mask 312 may selectively be removed by, for instance, using hydrogen fluoride.

As a result, the present invention enables the formation of circuit features having critical dimensions well beyond the resolution of presently available lithography techniques. Since complex and difficult resist trim processes are replaced by forming a stable hard mask for the patterning of the circuit feature, a significant improvement in production yield and cost reduction may be achieved. Moreover, in some embodiments, the critical dimension of the circuit feature is substantially defined by a deposition process rather than by a combination of photolithography and resist trim etching, thereby providing the potential for a reliable size reduction on the basis of presently available photolithography techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a layer above a substrate;
   forming a mask layer above said layer;
   forming an opening in said mask layer having dimensions that correspond to a circuit feature to be formed in said layer;
   forming an etch mask in said opening by exposing a surface of said layer within said opening and oxidizing via said exposed surface the material of said layer to change an etch behavior of the modified material compared to non-modified material with respect to a predefined etch recipe;
   removing said mask layer; and
   etching said layer by using said etch mask to form said circuit feature.

2. The method of claim 1, wherein said layer comprises at least a gate insulation layer and a layer of gate electrode material.

3. The method of claim 1, wherein forming said opening comprises forming an initial opening in said mask layer and forming spacer elements at sidewalls of said initial opening to adjust said dimensions of said circuit feature.

4. The method of claim 1, wherein modifying material of said layer comprises depositing a refractory metal and heat treating said substrate to initiate a chemical reaction, via the exposed surface, between the material of said layer and the refractory metal.

5. The method of claim 4, further comprising removing non-reacted refractory metal from said substrate.

6. The method of claim 4, wherein said refractory metal comprises at least one of cobalt, titanium, nickel, platinum and alloys thereof.

7. The method of claim 1, wherein said mask layer comprises silicon dioxide.

8. The method of claim 3, wherein said spacer elements are comprised of silicon nitride.

9. The method of claim 1, wherein said etch process is performed in a chlorine/bromine-containing plasma.

10. The method of claim 3, wherein forming said spacer elements comprises depositing an etch stop layer, depositing a spacer layer of predefined thickness and anisotropically etching said spacer layer selectively to said etch stop layer.

11. The method of claim 3, wherein forming said spacer elements comprises depositing a spacer layer over said mask layer including said initial opening and anisotropically etching said spacer layer.

12. The method of claim 1, further comprising removing said etch mask.

13. The method of claim 12, wherein said etch mask is removed prior to forming drain and source regions adjacent to said circuit feature.

14. The method of claim 1, further comprising determining a relation between a depth of modification of said layer formed on a second substrate and at least one modification process parameter prior to modifying said layer formed on said substrate.

15. The method of claim 14, farther comprising selecting a value of said at least one parameter on the basis of said relation to obtain a specified modification depth and using said value to modify said layer of said substrate.

16. The method of claim 15, wherein said surface of said layer is modified by forming a metal silicide, wherein said value is selected so as to obtain a modification depth that substantially corresponds to a design thickness of said metal silicide for a gate electrode of a specified field effect transistor.

17. The method of claim 1, wherein said mask layer is comprised of a substantially non-oxidizable material.

* * * * *

UNITED STATES PATENT AND TRADEMARK OFFICE
CERTIFICATE OF CORRECTION

| | | |
|---|---|---|
| PATENT NO. | : 7,151,055 B2 | Page 1 of 1 |
| APPLICATION NO. | : 10/974119 | |
| DATED | : December 19, 2006 | |
| INVENTOR(S) | : Massud Aminpur and Kay Hellig | |

It is certified that error appears in the above-identified patent and that said Letters Patent is hereby corrected as shown below:

In column 14, line 9, delete "farther," and insert -- further --.

Signed and Sealed this

Third Day of April, 2007

JON W. DUDAS
*Director of the United States Patent and Trademark Office*